United States Patent [19]

Saeki et al.

[11] Patent Number: 5,027,012
[45] Date of Patent: Jun. 25, 1991

[54] PROGRAMMABLE LOGIC CIRCUIT USING WIRED-OR TRISTATE GATES

[75] Inventors: Yukihiro Saeki; Yasoji Suzuki, both of Yokohama, Japan

[73] Assignee: Kabushiki Kaisha Toshiba, Kawasaki, Japan

[21] Appl. No.: 480,898

[22] Filed: Feb. 16, 1990

[30] Foreign Application Priority Data

Feb. 22, 1989 [JP] Japan .................................. 1-42402

[51] Int. Cl.$^5$ ........................................ H03K 19/094
[52] U.S. Cl. .................................. 307/465; 307/469; 307/473
[58] Field of Search ............... 307/443, 448, 451, 465, 307/468-469, 473; 364/716; 365/189.08

[56] References Cited

U.S. PATENT DOCUMENTS

| | | | |
|---|---|---|---|
| 3,439,185 | 4/1969 | Gibson | 307/469 |
| 4,124,899 | 10/1978 | Birkner et al. | 367/465 X |
| 4,558,236 | 12/1985 | Burrows 307 | 469 X/ |
| 4,620,117 | 10/1986 | Fang | 307/451 X |
| 4,706,216 | 10/1987 | Carter | 365/94 |
| 4,710,649 | 12/1987 | Lewis | 307/451 |
| 4,749,886 | 6/1988 | Hedayati | 307/473 X |
| 4,749,887 | 6/1988 | Sanwo et al. | 307/471 |
| 4,758,745 | 7/1988 | Elgamal et al. | 307/465 |
| 4,857,775 | 5/1984 | Ohata et al. | 307/468 |
| 4,910,417 | 3/1990 | Elgamal et al. | 307/465 |
| 4,912,348 | 3/1990 | Maki et al. | 307/468 X |

OTHER PUBLICATIONS

Van, T. et al., "A General Modified Universal Logic Module," Proceedings of the IEEE, pp. 646-648, published May, 1974.

Lloyd, A. M., "Design of Multiplexer Universal-Logic-Module Networks Using Spectral Techniques," IEEE Proc., vol. 127, Pt. E, No. 1, published Jan., 1980.

*Primary Examiner*—David Hudspeth
*Attorney, Agent, or Firm*—Finnegan, Henderson, Farabow, Garrett and Dunner

[57] ABSTRACT

A programmable logic circuit for deriving a logic output of first and second signals includes a 2-input logic gate for deriving a logic output of two signals. The 2-input logic gate is constituted by connecting two 3-state circuits in a wired OR configuration. One of the 3-state circuits includes a data input terminal, output control input terminal, and data output terminal, the output control input terminal receives an inverted signal of the second signal, and the data output terminal is set to one of three states of "1", "0", and the high impedance. Likewise, the other 3-state circuit includes a data input terminal, output control input terminal, and data output terminal, the output control input terminal receives the second signal, and the data output terminal is set to one of three states of "1", "0", and the high impedance. Each of the data input terminals of the 3-state circuits is supplied with a desired one of the first signal, an inverted signal of the first signal, a "0" level signal, and a "1" level signal in a programmable fashion. Various logic gates can be realized by programming the supplying states of the four signals.

16 Claims, 10 Drawing Sheets

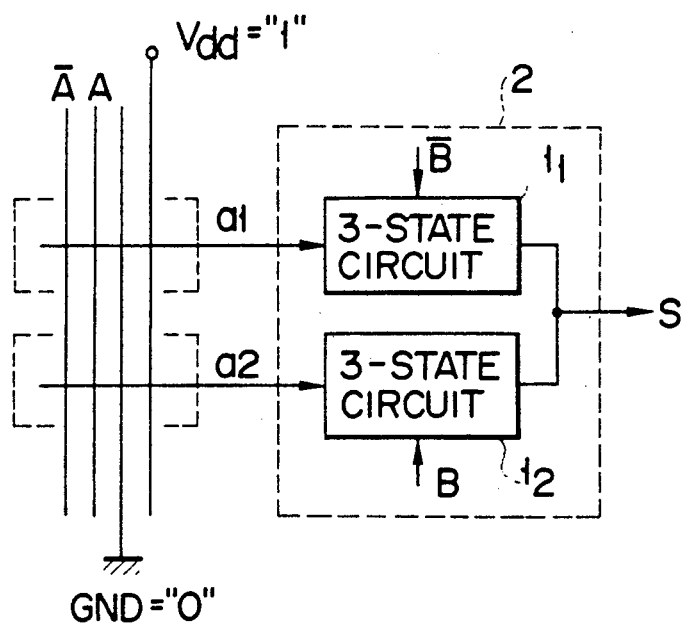
F I G. 1
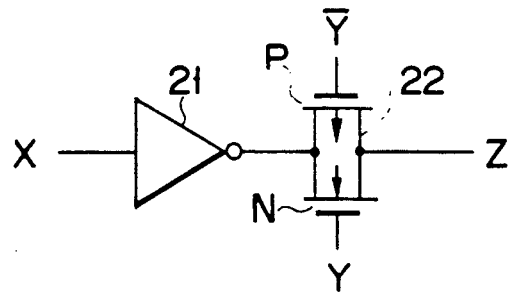
F I G. 2
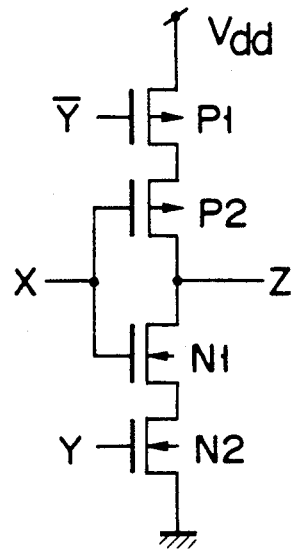
F I G. 3A
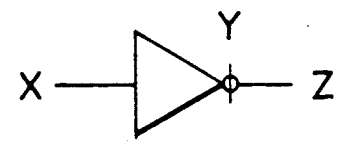
F I G. 3B

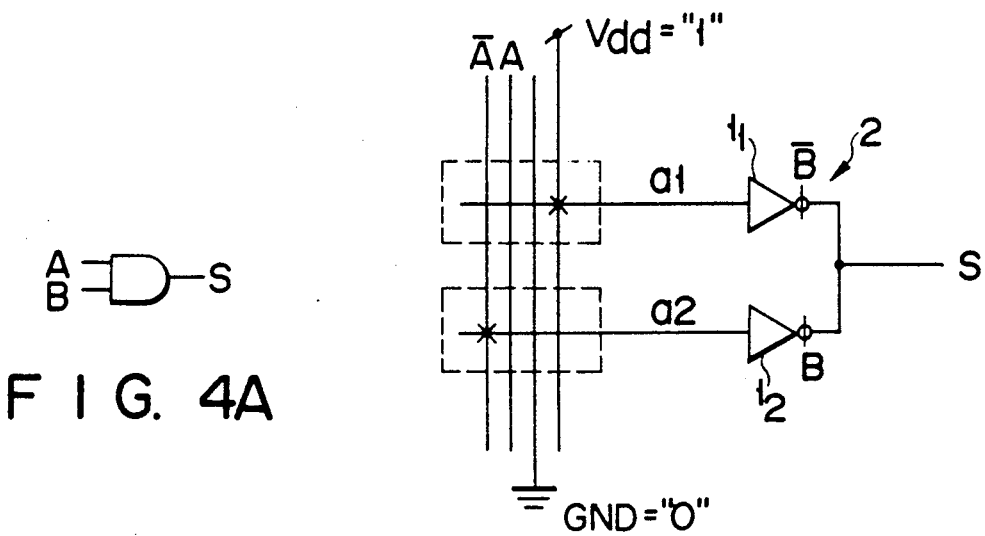
F I G. 4A
F I G. 4B
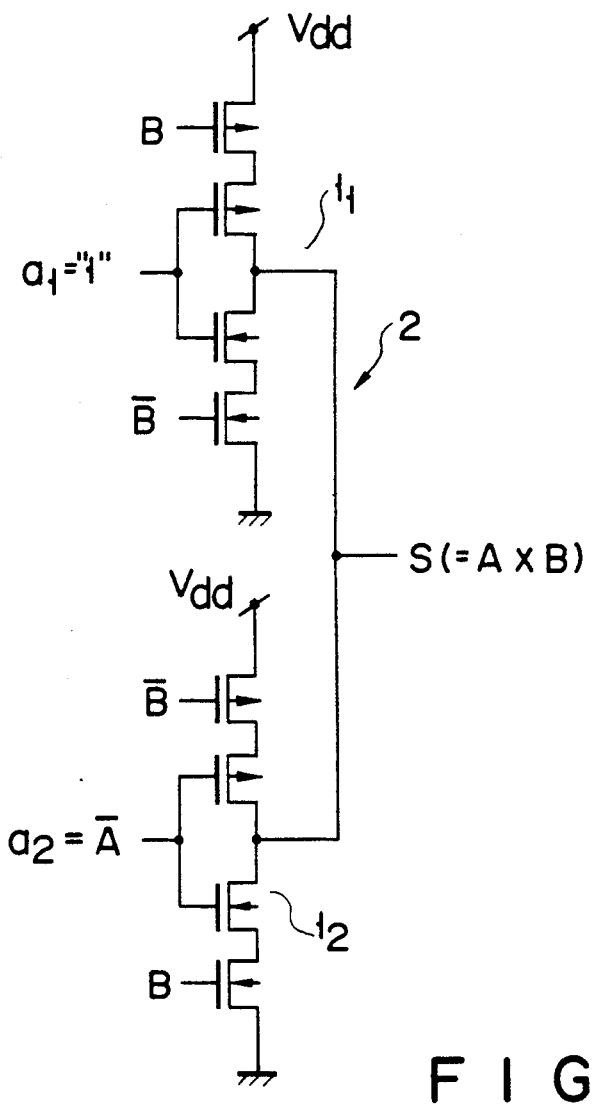
F I G. 5

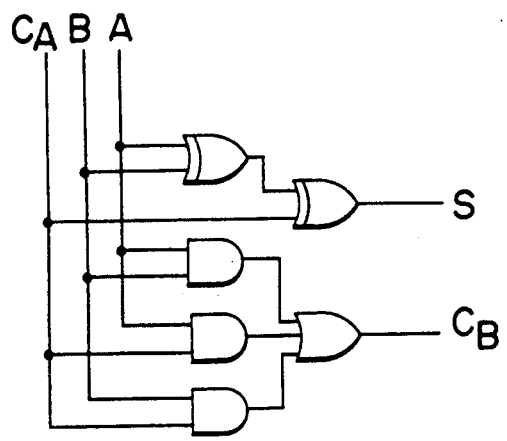
F I G. 14 (PRIOR ART)
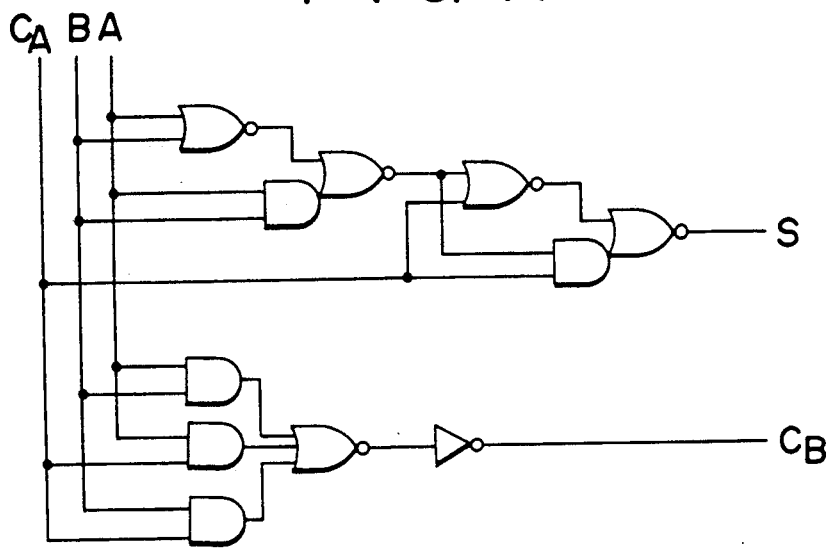
F I G. 15 (PRIOR ART)
| INPUT | | | OUTPUT | |
|---|---|---|---|---|
| A | B | $C_A$ | S | C |
| 0 | 0 | 0 | 0 | 0 |
| 1 | 0 | 0 | 1 | 0 |
| 0 | 1 | 0 | 1 | 0 |
| 1 | 1 | 0 | 0 | 1 |
| 0 | 0 | 1 | 1 | 0 |
| 1 | 0 | 1 | 0 | 1 |
| 0 | 1 | 1 | 0 | 1 |
| 1 | 1 | 1 | 1 | 1 |
F I G. 16 (PRIOR ART)

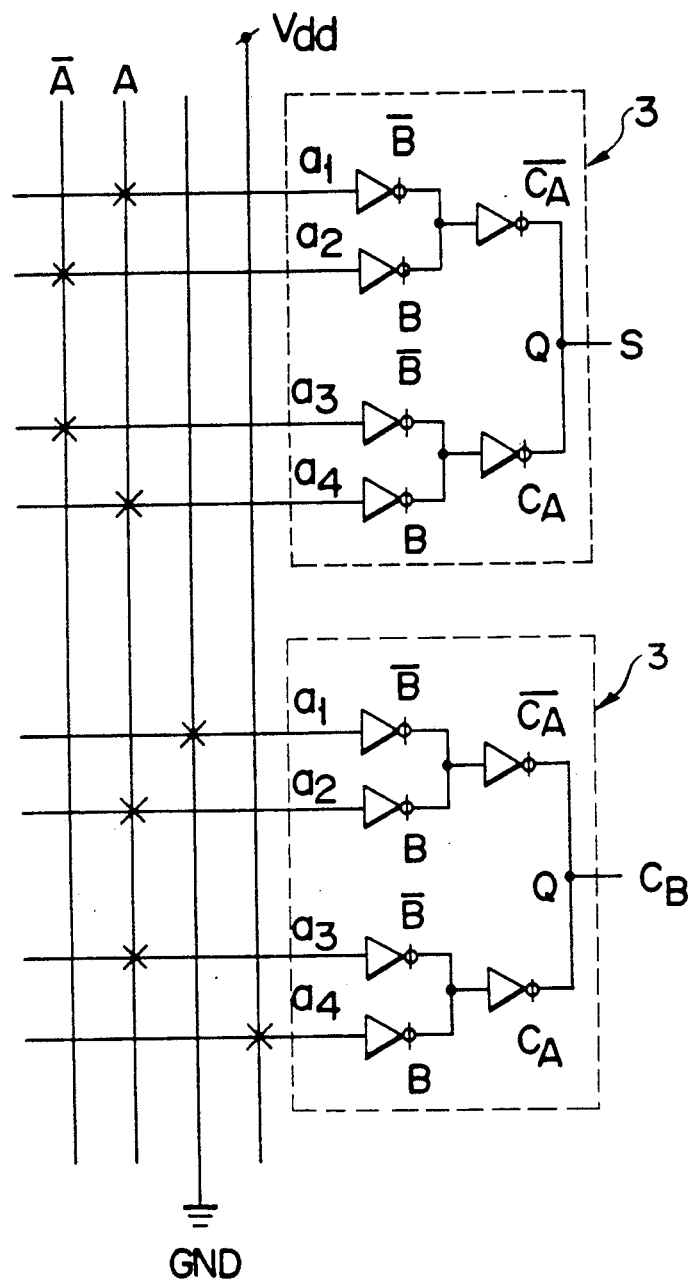
F I G. 17

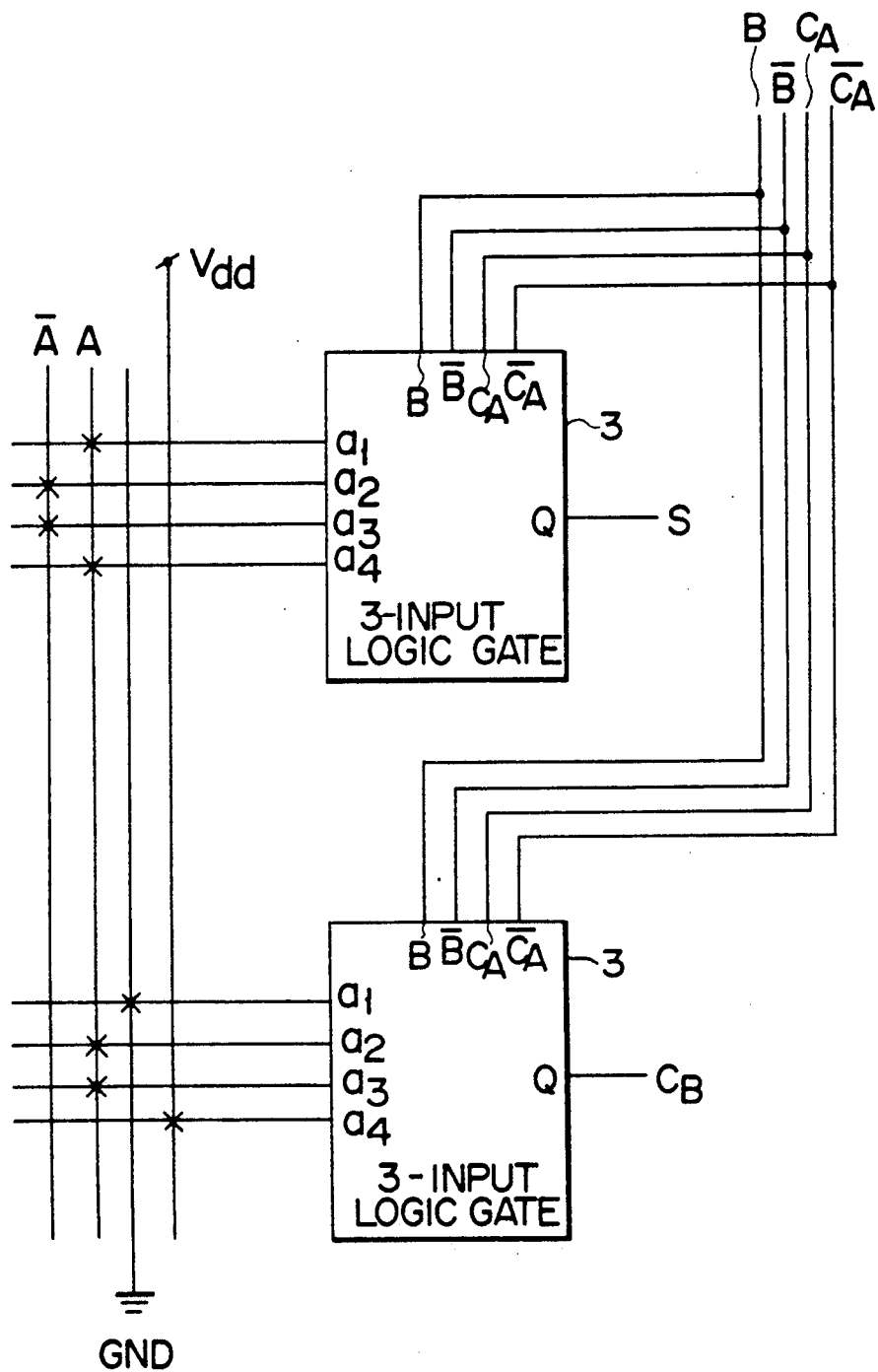
F I G. 18

PROGRAMMABLE LOGIC CIRCUIT USING WIRED-OR TRISTATE GATES

BACKGROUND OF THE INVENTION

1. Field of the Invention

This invention relates to a programmable logic circuit formed as a semiconductor integrated circuit, and more particularly to a programmable logic circuit which is extremely simple in construction and can be easily extended.

2. Description of the Related Art

When a logic circuit with several gates to several tens of gates is required, a general-purpose small-scale integrated circuit (SSI) has been generally used. A series of transistor-transistor logic (TTL) constructions and a series of complementary metal oxide semiconductor (CMOS) constructions are known as the SSI. In the above SSIs, a plurality of logic gates are sealed in one IC package and various types of gates are provided so that circuit designers may selectively purchase general-purpose SSIs as required to construct a desired logic circuit. ICs having 14 pins and four 2-input NAND gates and ICs having 14 pins and four 2-input NOR gates are widely known as such SSIs.

Such SSIs are commercially available in various areas and easy to be obtained, but they may frequently include useless portions for users. For example, when a user wants to obtain one 2-input NOR gate and one 2-input NAND gate, he will be most satisfied if he can find an IC containing one 2-input NOR gate and one 2-input NAND gate. However, there is no such SSI on the market and it is necessary to use an IC having four 2-input NOR gates as the 2-input NOR gate and an IC having four 2-input NAND gates as the 2-input NAND gate and as a result two ICs are necessary. Further, in this case, since each of the ICs has four gates as described before, three gates will not be used and become useless. When mounting the ICs on a substrate, it is necessary to form through holes for the logic gates which are not used and it is necessary to provide a space for the two ICs.

In this example, the circuit scale is very small. However, in a case where a digital circuit including several hundreds of gates is formed, the useless area will become much larger.

It is clear that the above problem can be solved by adding an IC having a 2-input NAND gate and a 2-input NOR gate contained therein to the SSI series and putting the IC on the market. However, the user's requirement is limitless. For example, even a 2-input logic gate includes various types of logic gates such as a NAND gate, NOR gate, AND gate, OR gate, exclusive OR gate, and exclusive NOR gate. Therefore, if an IC containing a plurality of such 2-input logic gates is formed, the number of types of the ICs may become extremely large, and neither the maker nor the user may control the ICs.

Further, it is necessary for the user to always stock all types of SSIs. Since the type of the logic gates which will be used is not previously known, it becomes necessary to stock a large number of general-purpose SSIs of more than 100 types. The control for the SSIs is complicated and it is necessary to provide a large space for keeping the SSIs.

Recently, in order to solve the above problem relating to the SSIs, the ICs called programmable logic devices (PLD) in which logic gates can be programmed have been developed. A PLD is an IC sealed a series of logic circuits therein which is formed by using the technique disclosed in U.S. Pat. No. 4,124,899 by Birkner et al. entitled "PROGRAMMABLE ARRAY LOGIC CIRCUIT", for example. In the above U.S. Patent, a plurality of vertical wirings are arranged on a plurality of lateral wirings which are connected to the input terminals of respective logic gates, memory cells are disposed at cross points arranged in a matrix form, and the lateral wirings are selectively connected to the vertical wirings via the selected cross points by selectively writing "0" or "1" into the memory cells. In this way, a desired logic circuit can be attained by making or breaking the connection between the lateral wirings and the vertical wirings.

The PLD is advantageous in that various logic circuits can be programmed. However, the programming process is complicated. And, the number of memory cells to be programmed is large, so it is necessary to program all the memory cells. Therefore, it is necessary to use a large-scale programming implement such as a personal computer. Further, it is necessary for the user to develop a complicated software for programming the PLD with a long period of time or purchase a software together with an expensive programming implement.

SUMMARY OF THE INVENTION

This invention has been made to solve the problem relating to the PLD, and an object of this invention is to provide a programmable logic circuit which is simple in construction and can be easily programmed and in which the gates can be easily extended.

In order to attain the above object, a programmable logic circuit of this invention for deriving a logic output of first and second signals comprises a 2-input logic gate for deriving a logic output of two input signals, the 2-input logic gate including a first 3-state circuit having a data input terminal, output control input terminal, and data output terminal, the output control input terminal being connected to receive an inverted signal of the second signal and the data output terminal being set in one of three states of "1", "0", and the high impedance according to the states of signals supplied to the data input terminal and output control input terminal, a second 3-state circuit having a data input terminal, output control input terminal, and data output terminal, the output control input terminal being connected to receive the second signal and the data output terminal being set in one of three states of "1", "0", and the high impedance according to the states of signals supplied to the data input terminal and output control input terminal, and wired OR means for deriving a logical sum of an output signal from the data output terminal of the first 3-state circuit and an output signal from the data output terminal of the second 3-state circuit; and supplying means for supplying a desired one of the first signal, the inverted signal of the first signal, a signal which is substantially always set at "0", and a signal which is substantially always set at "1" to the data input terminals of the first and second 3-state circuits in a programmable fashion.

According to the programmable logic circuit, a desired type of 2-input logic gate which receives the first and second signals as input signals and supplies a signal on the wired OR connection node as an output can be constructed by selectively setting the four signals.

Further, in the programmable logic circuit of this invention, the 2-input logic gates are connected in a tree structure to derive a logic output of a plurality of signals, the tree structure having a plurality of stages corresponding in number to the plurality of signals, the supplying means is connected to supply a desired one of the first signal, the inverted signal of the first signal, a signal which is substantially always set at "0", and a signal which is substantially always set at "1" only to the first-stage 2-input logic gates in a programmable fashion, and the output control input terminals of the first and second 3-state circuits of each of the 2-input logic gates other than the first-stage 2-input logic gates are supplied with complementary output control signals.

With this construction, a multi-input logic gate receiving the first signal and output control signals of the respective stages as input signals thereof can be formed. Further, it is also possible to form a logic gate circuit for receiving a large number of inputs and deriving a plurality of outputs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the construction of a 2-input logic gate according to one embodiment of a programmable logic circuit of this invention;

FIG. 2 is a circuit diagram showing the concrete construction of a 3-state circuit in FIG. 1;

FIGS. 3A and 3B are a circuit diagram showing the other concrete construction of a 3-state circuit shown in FIG. 1 and the logical representation thereof;

FIGS. 4A and 4B are the logical representation and logic circuit diagram of an AND gate constituted by 2-input logic gates shown in FIG. 1;

FIG. 5 is an actual circuit diagram of a 2-input AND gate of FIG. 4B;

FIG. 14 is a diagram showing the conventional logical representation of a full adder;

FIG. 15 is a logic circuit diagram of the full adder of FIG. 14 constituted by a conventional logic circuit;

FIG. 16 shows a truth table of the full adder shown in FIG. 14;

FIG. 17 is a logic circuit diagram showing a full adder according to another embodiment of a programmable logic circuit of this invention; and FIG. 18 is a circuit diagram showing the full adder of FIG. 17 with a circuit cell used as a unit.

DETAILED DESCRIPTION OF THE PREFERRED EMBODIMENTS

Figure 6A:
FIGS. 6A and 6B are the logical representation and logic circuit diagram of an OR gate constituted by 2-input logic gates shown in FIG. 1.

FIG. 1 shows a programmable logic circuit including a 2-input logic gate 2. The 2-input logic gate 2 is constructed by first and second 3-state circuits $1_1$ and $1_2$ whose outputs are connected in a wired OR configuration. The first and second 3-state circuits $1_1$ and $1_2$ are so controlled that when the output of one of the first and second 3-state circuits $1_1$ and $1_2$ is set in the high impedance state, the output of the other 3-state circuit may be set into the low impedance state. An output control signal B is input to the output control input terminal of the second 3-state circuit $1_2$ and a complementary signal or inverted signal $\bar{B}$ of the output control signal B is input to the output control input terminal of the first 3-state circuit $1_1$.

In this case, the first and second 3-state circuits $1_1$ and $1_2$ used as a basic circuit may be formed of a CMOS logic circuit as shown in FIG. 2 or FIGS. 3A and 3B, for example.

The 3-state circuit shown in FIG. 2 includes an inverter 21 and a transmission gate 22 constituted by a P-channel transistor P and an N-channel transistor N and serially connected to the inverter. In the 3-state circuit, a signal X is supplied to the inverter 21 and Y and $\bar{Y}$ (corresponding to signals B and $\bar{B}$) are supplied as a control signal (output control signal) of the transmission gate 22. When $Y = $ "0", the output Z is set into the high impedance state, and when $Y = $ "1", the output Z is set to an inverted signal $\bar{X}$ of the signal X.

The 3-state circuit shown in FIG. 3A is a clocked inverter which is logically equivalent to the 3-state circuit shown in FIG. 2 and is constituted by two P-channel transistors P1 and P2 and two N-channel transistors N1 and N2 whose current paths are serially connected. In the 3-state circuit, a signal X is an input and Y and $\bar{Y}$ (corresponding to signals B and $\bar{B}$) are supplied as high impedance controlling clock signals (output control signals). When $Y = $ "0", the output Z is set into the high impedance state, and when $Y = $ "1", the output Z is set to an inverted signal $\bar{X}$ of the signal X. The 3-state circuit of FIG. 3A is represented by a logic symbol shown in FIG. 3B.

In the 2-input logic gate 2, one of the following four signals is selectively input as an input $a_1$ on the data input terminal of the first 3-state circuit $1_1$ and one of the following four signals is selectively input as an input $a_2$ on the data input terminal of the second 3-state circuit $1_2$. In this way, any type of 2-input logic gate to which A first signal) and B (second signal) are input and from which a signal S on the wired OR connection node can be formed by properly selecting the four signals.

In this case, the four signals are a signal A, an inverted signal $\overline{A}$ which is complementary to the signal A, a signal which is normally kept at "0" level (ground potential GND in FIG. 3) and a signal which is normally kept at "1" level (power source potential $V_{dd}$ in FIG. 3).

An AND gate, OR gate, NAND gate, NOR gate, exclusive OR gate, and exclusive NOR gate are provided as a 2-input logic gate.

A 2-input AND gate represented by a logic symbol shown in FIG. 4A can be constructed as shown in FIG. 4B when the logic symbol shown in FIG. 3B is used as a 3-state circuit and an electrical connection node is expressed by a symbol "x". The actual circuit construction can be obtained as shown in FIG. 5 by replacing the 3-state circuit by the circuit shown in FIG. 3A.

That is, the AND gate selects a "1" level signal as the input $a_1$ of the first 3-state circuit $1_1$ whose output is controlled by the inverted signal $\overline{B}$ and selects the inverted signal $\overline{A}$ as the input $a_2$ of the second 3-state circuit $1_2$ whose output is controlled by the signal B. As a result, when the signal B is "1", the output of the first 3-state circuit $1_1$ is set into the high impedance state and the second 3-state circuit $1_2$ outputs a signal A which is obtained by inverting the inverted signal $\overline{A}$. Thus, the wired OR output S is set to A ($=A \times B$).

In contrast, when the signal B is "0", the first 3-state circuit $1_1$ outputs a "0" level signal which is obtained by inverting a "1" level signal and the output of the second 3-state circuit $1_2$ is set into the high impedance state. As a result, the wired OR output is set to "0" level.

As described above, a 2-input AND gate can be realized by selecting a "1" level signal as the input $a_1$ of the first 3-state circuit $1_1$ whose output is controlled by the inverted signal $\overline{B}$ and selecting an inverted signal $\overline{A}$ as the input $a_2$ of the second 3-state circuit $1_2$ whose output is controlled by the signal B.

Figure 6B:
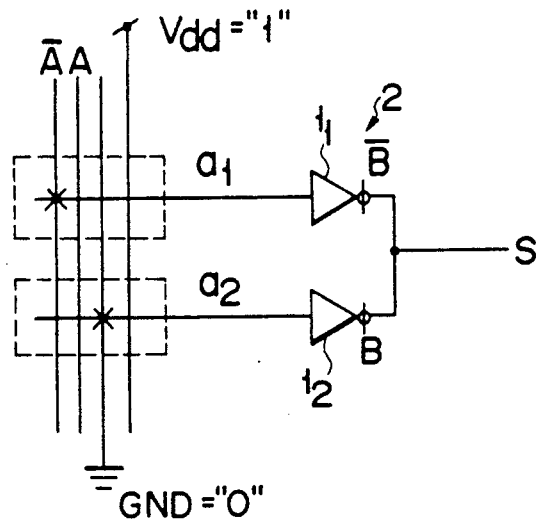

A 2-input OR gate represented by a logic symbol shown in FIG. 6A can be constructed as shown in FIG. 6B when the logic symbol shown in FIG. 3B is used as a 3-state circuit and an electrical connection node is expressed by a symbol "x". Of course, the actual circuit construction can be easily obtained by replacing the 3-state circuit by the circuit shown in FIG. 3A in the same manner as described with reference to the relation between FIGS. 4B and 5 in the case of forming the AND gate.

That is, the OR gate selects an inverted signal $\overline{A}$ as the input $a_1$ of the first 3-state circuit $1_1$ whose output is controlled by the inverted signal $\overline{B}$ and selects a "0" level signal as the input $a_2$ of the second 3-state circuit $1_2$ whose output is controlled by the signal B. Therefore, when the signal B is "1", the output of the first 3-state circuit $1_1$ is set into the high impedance state and the second 3-state circuit $1_2$ outputs a "1" level signal which is obtained by inverting "0" level signal. As a result, the wired OR output S is set to "1" level ($=B$).

In contrast, when the signal B is "0", the first 3-state circuit $1_1$ outputs a signal A which is obtained by inverting an inverted signal $\overline{A}$ and the output of the second 3-state circuit $1_2$ is set into the high impedance state. As a result, the wired OR output is set to the signal A.

As described above, a 2-input OR gate can be realized by selecting an inverted signal $\overline{A}$ as the input $a_1$ of the first 3-state circuit $1_1$ whose output is controlled by the inverted signal $\overline{B}$ and selecting a "0" level signal as the input $a_2$ of the second 3-state circuit $1_2$ whose output is controlled by the signal B.

Figure 7A:
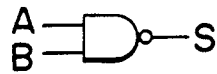
FIGS. 7A and 7B are the logical representation and logic circuit diagram of a NAND gate constituted by 2-input logic gates shown in FIG. 1.
Figure 7B:
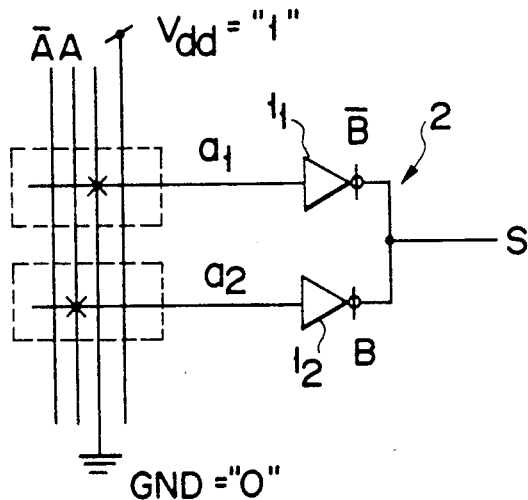

A 2-input NAND gate is represented by a logic symbol shown in FIG. 7A can be constructed as shown in FIG. 7B when the logic symbol shown in FIG. 3B is used as a 3-state circuit and an electrical connection node is expressed by a symbol "x". Of course, the actual circuit construction can be easily obtained by replacing the 3-state circuit by the circuit shown in FIG. 3A in the same manner as described with reference to the relation between FIGS. 4B and 5 in the case of forming the AND gate.

That is, the NAND gate selects a "0" level signal as the input $a_1$ of the first 3-state circuit $1_1$ whose output is controlled by the inverted signal $\overline{B}$ and selects a signal A as the input $a_2$ of the second 3-state circuit $1_2$ whose output is controlled by the signal B. Therefore, when the signal B is "1", the output of the first 3-state circuit $1_1$ is set into the high impedance state and the second 3-state circuit $1_2$ outputs an inverted signal $\overline{A}$ which is obtained by inverting the signal A. As a result, the wired OR output S is set to the inverted signal $\overline{A}$.

In contrast, when the signal B is "0", the first 3-state circuit $1_1$ outputs a "1" level signal which is obtained by inverting a "0" level signal and the output of the second 3-state circuit $1_2$ is set into the high impedance state. As a result, the wired OR output is set to "1" level.

As described above, a 2-input NAND gate can be realized by selecting a "0" level signal as the input $a_1$ of the first 3-state circuit $1_1$ whose output is controlled by the inverted signal $\overline{B}$ and selecting the signal A as the input $a_2$ of the second 3-state circuit $1_2$ whose output is controlled by the signal B.

Figure 8A:
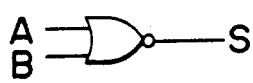
FIGS. 8A and 8B are the logical representation and logic circuit diagram of a NOR gate constituted by 2-input logic gates shown in FIG. 1.
Figure 8B:
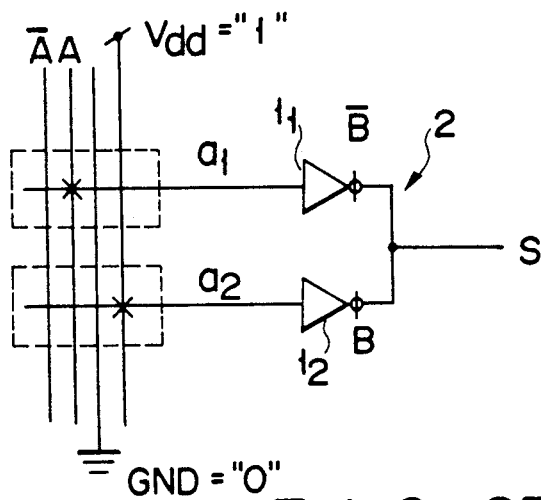

A 2-input NOR gate represented by a logic symbol shown in FIG. 8A can be constructed as shown in FIG. 8B when the logic symbol shown in FIG 3B is used as a 3-state circuit and an electrical connection node is expressed by a symbol "x". Of course, the actual circuit construction can be easily obtained by replacing the 3-state circuit by the circuit shown in FIG. 3A in the same manner as described with reference to the relation between FIGS. 4B and 5 in the case of forming the AND gate.

That is, the NOR gate selects a signal A as the input $a_1$ of the first 3-state circuit $1_1$ whose output is controlled by the inverted signal $\overline{B}$ and selects "1" level signal as the input $a_2$ of the second 3-state circuit $1_2$ whose output is controlled by the signal B. Therefore, when the signal B is "1", the output of the first 3-state circuit $1_1$ is set into the high impedance state and the second 3-state circuit $1_2$ outputs a "0" level signal which is obtained by inverting "1" level signal. As a result, the wired OR output S is set to "0" level.

In contrast, then the signal B is "0", the first 3-state circuit $1_1$ outputs an inverted signal $\overline{A}$ which is obtained by inverting a signal A and the output of the second 3-state circuit $1_2$ is set into the high impedance state. As a result, the wired OR output is set to the inverted signal $\overline{A}$.

As described above, a 2-input NOR gate can be realized by selecting a signal A as the input $a_1$ of the first 3-state circuit $1_1$ whose output is controlled by the inverted signal $\overline{B}$ and selecting "1" level signal as the input $a_2$ of the second 3-state circuit $1_2$ whose output is controlled by the signal B.

Figure 9A:
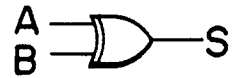
FIGS. 9A and 9B are the logical representation and logic circuit diagram of an exclusive OR gate constituted by 2-input logic gates shown in FIG. 1.
Figure 9B:
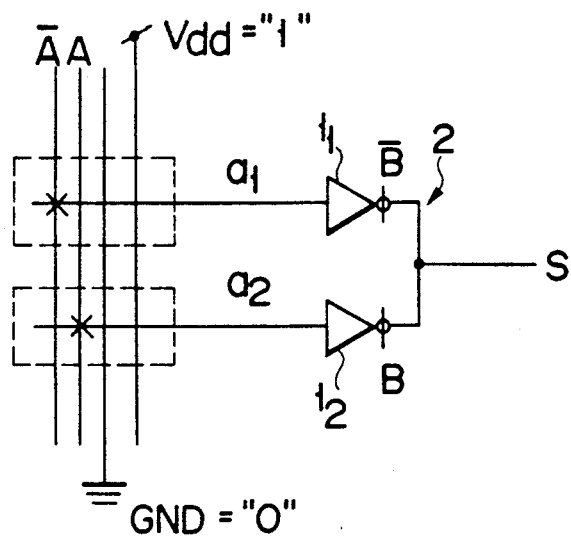

A 2-input exclusive OR gate represented by a logic symbol shown in FIG. 9A can be constructed as shown in FIG. 9B when the logic symbol shown in FIG. 3B is used as a 3-state circuit and an electrical connection node is expressed by a symbol "x". Of course, the actual circuit construction can be easily obtained by replacing the 3-state circuit by the circuit shown in FIG. 3A in the same manner as described with reference to the relation between FIGS. 4B and 5 in the case of forming the AND gate.

That is, the exclusive OR gate selects an inverted signal $\overline{A}$ as the input $a_1$ of the first 3-state circuit $1_1$ whose output is controlled by the inverted signal $\overline{B}$ and selects a signal A as the input $a_2$ of the second 3-state circuit $1_2$ whose output is controlled by the signal B. Therefore, when the signal B is "1", the output of the first 3-state circuit $1_1$ is set into the high impedance state and the second 3-state circuit $1_2$ outputs the inverted signal $\overline{A}$ which is obtained by inverting the signal A. As a result, the wired OR output S is set to the inverted signal $\overline{A}$.

In contrast, when the signal B is "0", the first 3-state circuit $1_1$ outputs a signal A which is obtained by inverting the inverted signal $\overline{A}$ and the output of the second 3-state circuit $1_2$ is set into the high impedance state. As a result, the wired OR output is set to the signal A.

As described above, a 2-input exclusive OR gate can be realized by selecting an inverted signal $\overline{A}$ as the input $a_1$ of the first 3-state circuit $1_1$ whose output is controlled by the inverted signal $\overline{B}$ and selecting a signal A as the input $a_2$ of the second 3-state circuit $1_2$ whose output is controlled by the signal B.

Figure 10A:
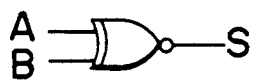
FIGS. 10A and 10B are the logical representation and logic circuit diagram of an exclusive NOR gate constituted by 2-input logic gates shown in FIG. 1.
Figure 10B:
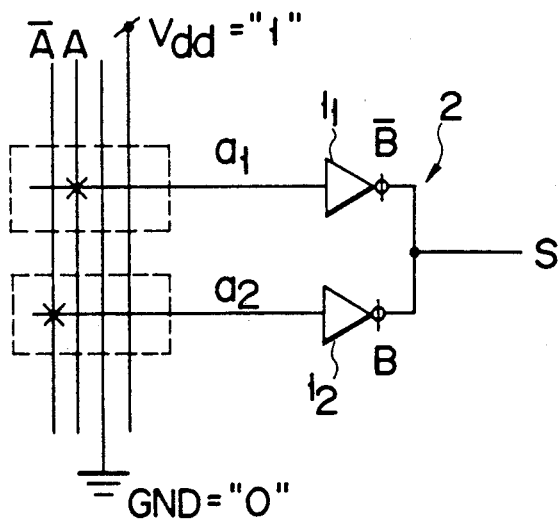

Further, a 2-input exclusive NOR gate represented by a logic symbol shown in FIG. 10A can be constructed as shown in FIG 10B when the logic symbol shown in FIG. 3B is used as a 3-state circuit and an electrical connection node is expressed by a symbol "x". Of course, the actual circuit construction can be easily obtained by replacing the 3-state circuit by the circuit shown in FIG. 3A in the same manner as described with reference to the relation between FIGS. 4B and 5 in the case of forming the AND gate.

That is, the exclusive NOR gate selects a signal A as the input $a_1$ of the first 3-state circuit $1_1$ whose output is controlled by the inverted signal $\overline{B}$ and selects an inverted signal $\overline{A}$ as the input $a_2$ of the second 3-state circuit $1_2$ whose output is controlled by the signal B. Therefore, when the signal B is "1", the output of the first 3-state circuit $1_1$ is set into the high impedance state and the second 3-state circuit $1_2$ outputs the signal A which is obtained by inverting the inverted signal $\overline{A}$. As a result, the wired OR output S is set to the signal A.

In contrast, when the signal B is "0", the first 3-state circuit $1_1$ outputs an inverted signal $\overline{A}$ which is obtained by inverting the signal A and the output of the second 3-state circuit $1_2$ is set into the high impedance state. As a result, the wired OR output is set to the inverted signal $\overline{A}$.

As described above, a 2-input exclusive NOR gate can be realized by selecting a signal A as the input $a_1$ of the first 3-state circuit $1_1$ whose output is controlled by the inverted signal $\overline{B}$ and selecting an inverted signal $\overline{A}$ as the input $a_2$ of the second 3-state circuit $1_2$ whose output is controlled by the signal B.

In order to make or program the electrical connection node represented by the symbol "x", various methods can be considered. For example, it can be programmed by selectively connecting or disconnecting signal lines of four signals to or from the respective 3-state circuits by using a method disclosed in the aforementioned U.S. Pat. No. 4,124,899 or a method disclosed in U.S. Pat. No. 4,758,745 by Elgamal et al, entitled "USER PROGRAMMABLE INTEGRATED CIRCUIT INTERCONNECT ARCHITECTURE AND TEST METHOD". Even if these methods are used, the programmable logic circuit of this invention can be used even when all the connection nodes are not programmed, and in this case, it is only necessary to properly select as few as four signals so that the programming can be extremely simplified as compared with the prior art case.

Further, a logic gate with a desired number of inputs such as 3, 4, or 5, . . . inputs can be formed in the same manner as in the case of forming the 2-input logic gate if 3-state circuits and means for selecting one of four signals of complementary signals A and $\overline{A}$, and "0" level and "1" level signals are provided.

Figures 11A, 11B:
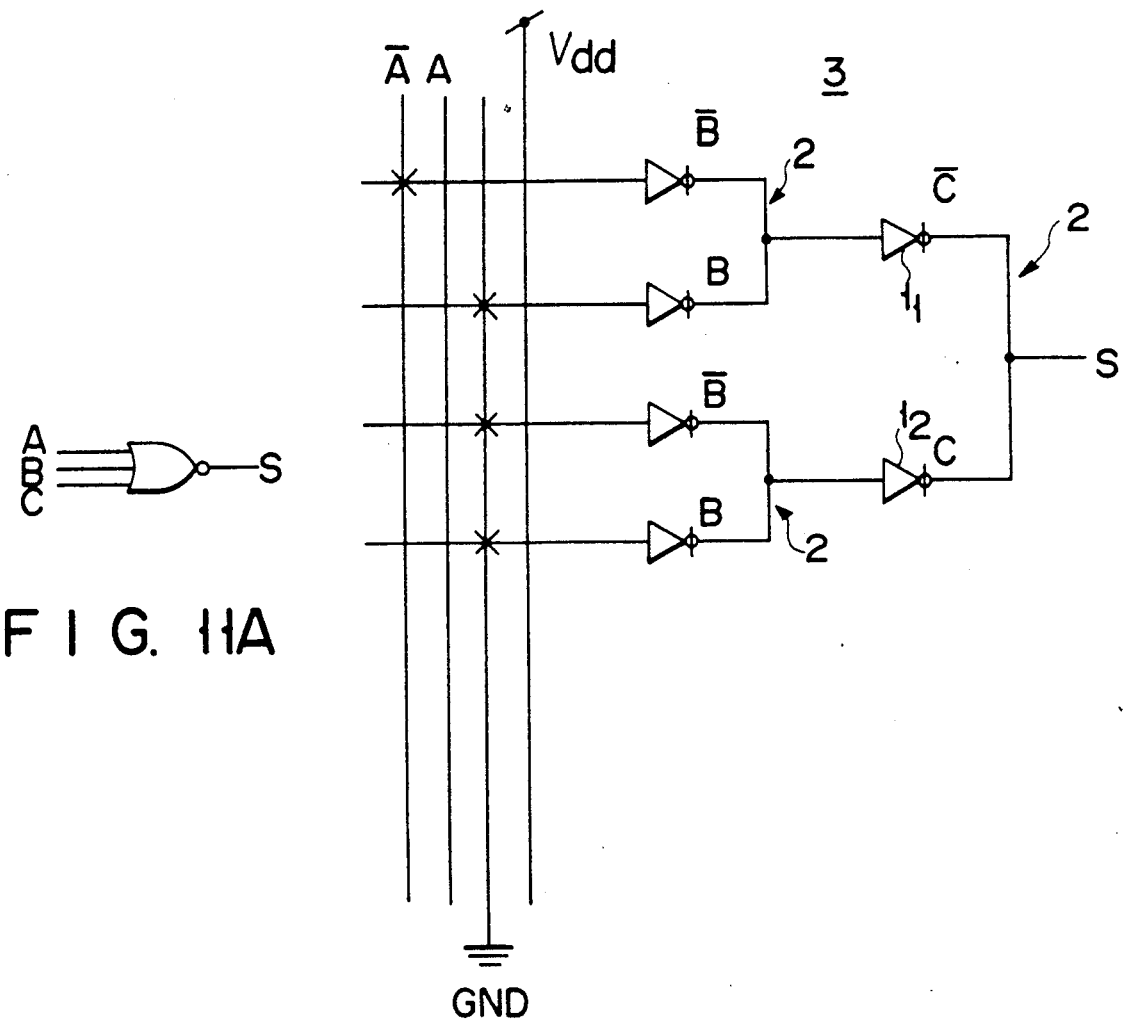
FIGS. 11A and 11B are the logical representation and logic circuit diagram of a 3-input NOR gate formed as a 3-input logic gate according to another embodiment of a programmable logic circuit of this invention.

For example, a 3-input NOR gate represented by a logic symbol shown in FIG. 11A can be formed by using a 3-input logic gate 3 shown in FIG. 11B. The 3-input logic gate is constructed by connecting the 2-input logic gates according to the first embodiment of this invention in two-stage structure in which two 2-input logic gates 2 are used in the first stage and one 2-input logic gate 2 is used in the second stage. Wired OR outputs of the two first-stage 2-input logic gates are input to the respective input terminals of the two 3-state circuits $1_1$ and $1_2$ of the second-stage 2-input logic gate 2. Further, the output control input terminals of the 3-state circuits $1_1$ and $1_2$ are supplied with a third signal C and an inverted signal $\overline{C}$ is in complementary relation to the signal C. A logic output S of the first signal A, second signal B, and third signal C is derived from the wired OR connection node of the second-stage 2-input logic gate 2.

As shown in FIG. 11B, in order to constitute a 3-input NOR gate, an inverted signal $\overline{A}$ is selected as the input of one of the 3-state circuits of the first-stage input logic gates 2 whose output is controlled by the inverted signal $\overline{B}$, a "0" level signal is selected as the input of the other 3-state circuit whose output is controlled by the signal B, a "0" level signal is selected as the input of one of the 3-state circuits of the other of the first-stage 2-input logic gates 2 whose output is controlled by the inverted signal $\overline{B}$, and a "0" level signal is selected as the input of the other 3-state circuit whose output is controlled by the signal B. Likewise, any type of 3-input logic gate which receives signals A (first signal), B (second signal), and C (third signal) as the inputs thereof and outputs a signal S on the wired OR connection node of the second-stage 2-input logic gate 2 can be formed by adequately selecting the four signals.

Figure 12A:
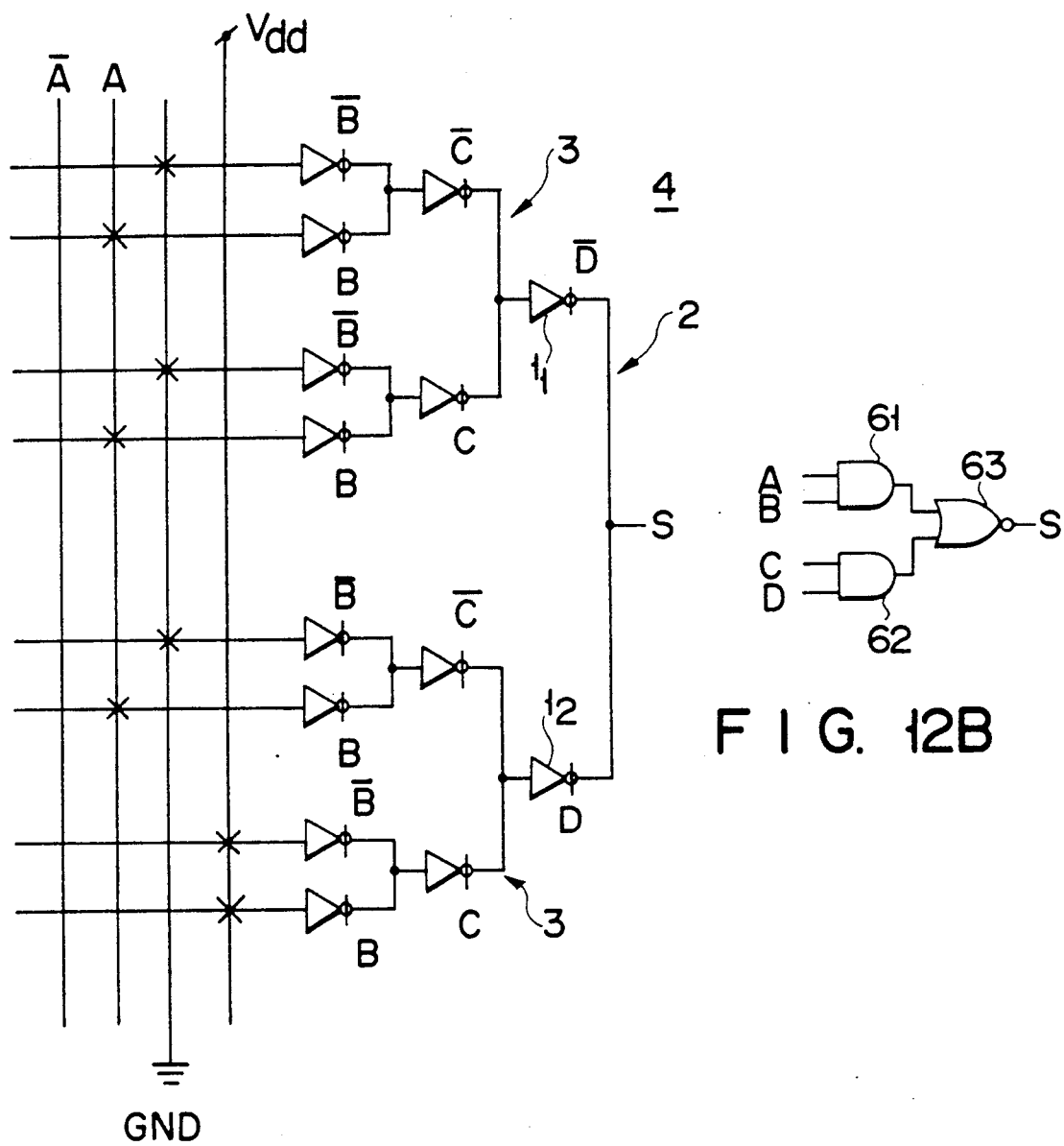
FIGS. 12A and 12B are a logic circuit diagram of a 4-input NOR gate formed as a 4-input logic gate according to still another embodiment of a programmable logic circuit of this invention and the logical representation showing the equivalent construction thereof.

FIG. 12A shows a 4-input logic gate 4 according to a third embodiment of this invention. The 4-input logic gate 4 includes two 3-input logic gates 3 according to the second embodiment of this invention and one 2-input logic gate 2 according to the first embodiment of this invention arranged in the latter stage thereof. Respective wired OR outputs of the two first-stage 3-input logic gates 3 are input to the respective input terminals of the two 3-state circuits $1_1$ and $1_2$ of the latter-stage 2-input logic gate 2. Further, the output control input terminals of the 3-state circuits $1_1$ and $1_2$ are supplied with a fourth signal D and an inverted signal $\overline{D}$ which is in complementary relation to the signal D. A logic output S of the first signal A, second signal B, third signal C, and fourth signal D is derived from the wired OR connection node of the latter-stage 2-input logic gate.

Figure 12B:
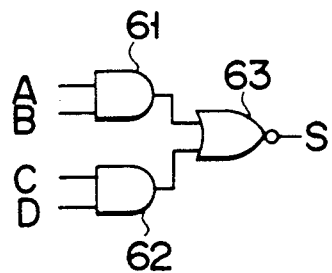

For example, in order to constitute a 4-input NOR gate by using the 4-input logic gate 4 with the above construction, the input terminals of the 3-state circuits whose outputs are controlled by the signal B and inverted signal $\overline{B}$ are connected to the four signal lines as shown in FIG. 12A. As shown in FIG 12B, the 4-input NOR gate is equivalently expressed by a circuit including a first AND gate 61 connected to receive the signals A and B, a second AND gate 62 connected to receive the signals C and D, and a NOR gate 63 connected to receive outputs of the first and second AND gates 61 and 62.

Likewise, any type of 4-input logic gate which receives the signals A (first signal), B (second signal), C (third signal), and D (fourth signal) as the inputs thereof and outputs a signal S on the wired OR connection node of the final-stage 2-input logic gate 2 can be formed by adequately selecting the four signals.

Figure 13A:
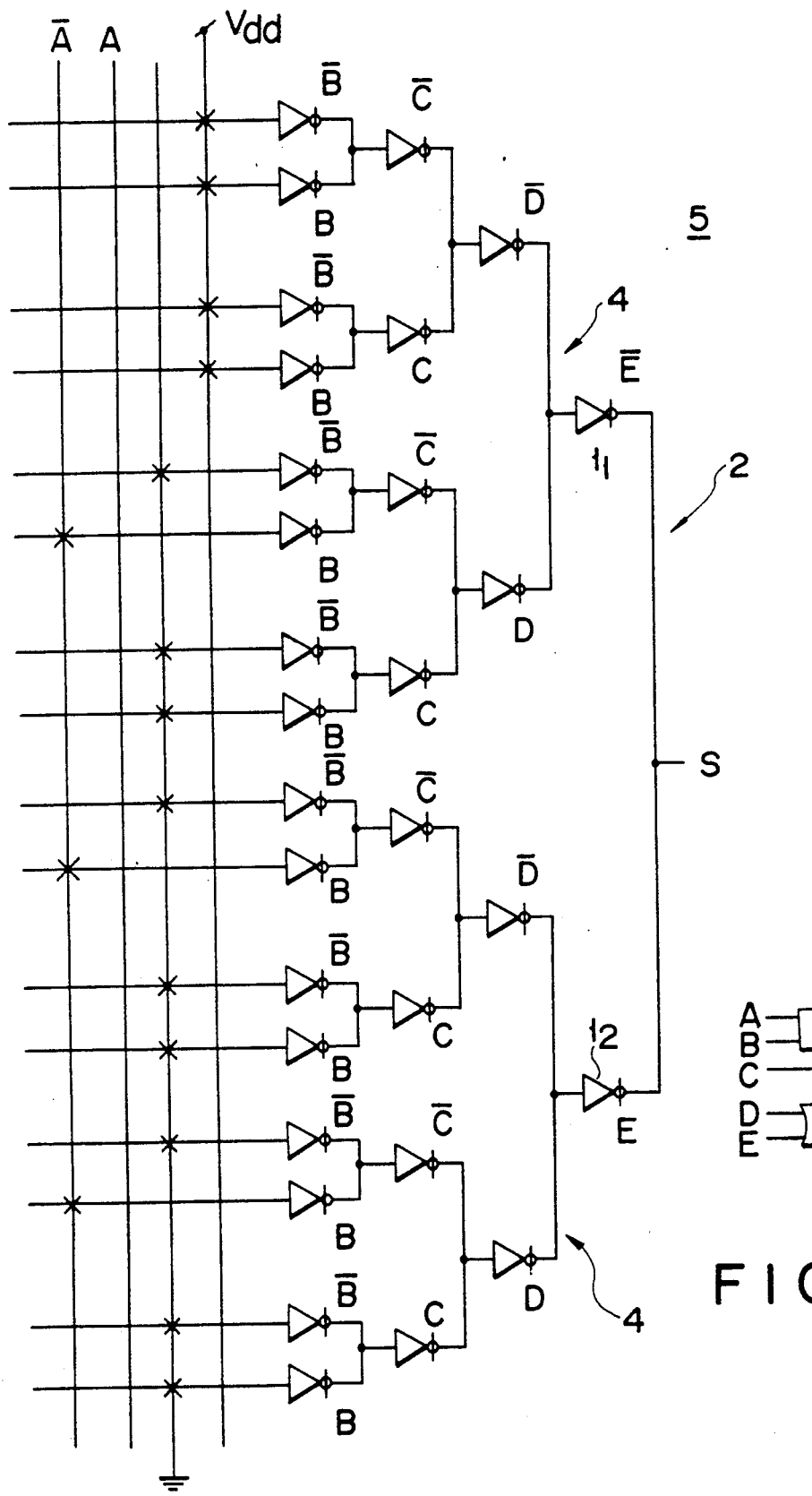
FIGS. 13A and 13B are a logic circuit diagram of a 5-input NOR gate formed as a 5-input logic gate according to another embodiment of a programmable logic circuit of this invention and the logical representation showing the equivalent construction thereof.

FIG. 13A shows a 5-input logic gate 5 according to a fourth embodiment of this invention. The 5-input logic gate 5 includes two 4-input logic gates 4 according to the third embodiment of this invention and one 2-input logic gate 2 according to the first embodiment of this invention arranged in the latter stage thereof. Respective wired OR outputs of the two first-stage 4-input logic gates 4 are input to the respective input terminals of the two 3-state circuits $1_1$ and $1_2$ of the latter-stage 2-input logic gate 2. Further, the output control input terminals of the 3-state circuits $1_1$ and $1_2$ are supplied with a fifth signal E and an inverted signal $\overline{E}$ which is in complementary relation to the signal E. A logic output S of the first signal A, second signal B, third signal C, fourth signal D, and fifth signal E is derived from the wired OR connection node of the latter-stage 2-input logic gate 2.

Figure 13B:
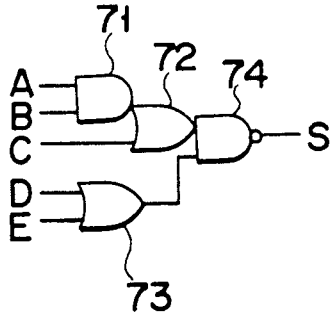

For example, in order to constitute a 5-input NOR gate by using the 5-input logic gate 5 with the above construction, the input terminals of the 3-state circuits whose outputs are controlled by the signal B and inverted signal $\overline{B}$ are connected to the four signal lines as shown in FIG. 13A. As shown in FIG. 13B, the 5-input NOR gate is equivalently expressed by a circuit including a first AND gate 71 connected to receive the signals A and B, a first OR gate 72 connected to receive an output of the AND gate 71 and the signal C, a second OR gate 73 connected to receive the signals D and E, and a NAND gate 74 connected to receive outputs of the first and second OR gates 72 and 73.

Likewise, any type of 5-input logic gate which receives the signals A (first signal), B (second signal), C (third signal), D (fourth signal), and E (fifth signal) as the inputs thereof and outputs a signal S on the wired OR connection node of the final-stage 2-input logic gate 2 can be formed by adequately selecting the four signals.

As described above, according to this invention, circuit sections each formed by connecting two 3-state circuits in a wired OR configuration may be connected in a tree structure so as to constitute various types of logic gates. That is, 2-input logic gates of two or more stages are connected in a tree structure. Each of the logic gates includes data input, output control input and output terminals. The data output terminal is formed by connecting the data output terminals of the two 3-state circuits which selectively take one of the three states of "1", "0", and the high impedance state in a wired OR configuration. In this case, when the output of one of the 3-state circuits is set in the high impedance state, the output of the other 3-state circuit is controlled to be set in the low impedance state. Each of the logic gates outputs a logic output determined by the input of the data input terminal and the input of the output control input terminal from the wired OR connection node. The first-stage logic gate supplies one of a signal which is substantially always set at "1", a signal which is substantially always set at "0", a first signal A and an inverted signal $\overline{A}$ which is obtained by inverting the first signal A to the data input terminal and supplied a second signal B and an inverted signal $\overline{B}$ which is obtained by inverting the second signal B to the output control input terminal. Outputs of the two preceding-stage logic gates are supplied to the data input terminals of the two 3-state circuits of the second stage or succeeding stage and complementary signals C and $\overline{C}$, D and $\overline{D}$, E and $\overline{E}$, - - - are supplied to the output control input terminals of the 3-state circuits of the second- or succeeding-stage logic gate. With this construction, it becomes possible to constitute various types of logic gates.

According to this invention, any type of combinational logic circuit having a desired number of inputs can be constructed. In the above explanation, the logic circuit is constructed to have a single output. However, it is possible to form a logic circuit deriving out a plurality of outputs in response to a large number of inputs. One example of this is a full adder.

A 1-bit full adder creates two outputs of sum S and carry signal $C_B$ to the next stage based on three inputs of A, B, and carry signal $C_A$ from the preceding stage. FIG. 14 shows the standard logical representation of the full adder, FIG, 15 shows the conventional logic circuit which constitutes the full adder by using CMOS circuits, and FIG. 16 shows the truth table thereof.

FIG. 17 shows a logic circuit constructed by using this invention to attain the same logic as the above full adder. That is, the logic circuit uses two 3-input logic gates 3 and is so constructed that the sum S can be obtained as an output of one of the logic gates 3 and the carry signal $C_B$ to the next stage can be derived as an output of the other logic gate 3. It should be noted here that the logic circuit of this invention has a large extent of symmetry. The circuits for forming the sum S and carry signal $C_B$ to the next stage are quite different from each other in the prior art case shown in FIG. 15, but according to this invention, the circuits for forming the sum S and carry signal $C_B$ to the next stage can be each constructed by the same 3-input logic gate 3. Therefore, if the 3input logic gate 3 in FIG. 17 is expressed by a circuit cell, the full adder can be simply represented as shown in FIG. 18.

As described above, according to this invention, a programmable logic circuit which is simple in construction and programming operation and in which the gate can be easily extended can be realized.

Further, according to this invention, a desired logic circuit having a large degree of symmetry can be realized by using a logic circuit having a 3-state output as a smallest unit and connecting the smallest units in a tree structure. Also, a multi-input logic gate complicated in construction can be easily obtained. Further, since it is only necessary to select one of the "1" level signal, "0" level signal, signal A, and signal $\overline{A}$ in order to program the input, the circuit programming can be easily effected and the programming implement can be made simple in construction. When memory cells are used to effect the programming operation, the number of memory cells can be significantly reduced and an easily programmable IC can be realized.

Therefore, the user is only required to store the least number of types of logic ICs and the maker can simplify the production control.

Additional advantages and modifications will readily occur to those skilled in the art. Therefore, the invention in its broader aspects is not limited to the specific details and representative devices shown and described herein. Accordingly, various modifications may be made without departing from the spirit or scope of the general inventive concept as defined by the appended claims and their equivalents.

What is claimed is:

1. A programmable logic circuit for deriving a logic output of first and second signals comprising:
    a 2-input logic gate for deriving a logic output of two input signals, said 2-input logic gate including:
    a first 3-state circuit having a data input terminal, output control input terminal, and data output terminal, the output control input terminal being connected to receive an inverted signal of the second signal and the data output terminal being set in one of three states of "1", "0", and the high impedance according to the states of signals supplied to the data input terminal and output control input terminal,
    a second 3-state circuit having a data input terminal, output control input terminal, and data output terminal, the output control input terminal being connected to receive the second signal and the data output terminal being set in one of the three states of "1", "0", and the high impedance according to the states of signals supplied to the data input terminal and output control input terminal, and
    wired OR means for deriving a logical sum of an output signal from the data output terminal of said first 3-state circuit and an output signal from the data output terminal of said second 3-state circuit; and
    supplying means for supplying a desired one of the first signal, the inverted signal of the first signal, a signal which is substantially always set at "0", and a signal which is substantially always set at "1" to the data input terminals of said first and second 3-state circuits in a programmable fashion.

2. The circuit according to claim 1, wherein said supplying means supplies a signal which is substantially always set at "1" level to the data input terminal of said first 3-state circuit and supplies an inverted signal of the first signal to the data input terminal of said second 3-state circuit to constitute an AND gate.

3. The circuit according to claim 1, wherein said supplying means supplies an inverted signal of the first signal to the data input terminal of said first 3-state circuit and supplies a signal which is substantially always set at "0" level to the data input terminal of said second 3-state circuit to constitute an OR gate.

4. The circuit according to claim 1, wherein said supplying means supplies a signal which is substantially always set at "0" level to the data input terminal of said first 3-state circuit and supplies the first signal to the data input terminal of said second 3-state circuit to constitute a NAND gate.

5. The circuit according to claim 1, wherein said supplying means supplies the first signal to the data input terminal of said first 3-state circuit and supplies a signal which is substantially always set at "1" level to the data input terminal of said second 3-state circuit to constitute a NOR gate.

6. The circuit according to claim 1, wherein said supplying means supplies an inverted signal of the first signal to the data input terminal of said first 3-state circuit and supplies the first signal to the data input terminal of said second 3-state circuit to constitute an exclusive OR gate.

7. The circuit according to claim 1, wherein said supplying means supplies the first signal to the data input terminal of said first 3-state circuit and supplies an inverted signal of the first signal to the data input terminal of said second 3-state circuit to constitute an exclusive NOR gate.

8. The circuit according to claim 1, including a plurality of 2-input logic gates connected in a tree structure to derive a logic output of a plurality of signals, said tree structure having a plurality of stages corresponding in number to the plurality of signals, and
    said supplying means is connected to supply a desired one of the first signal, the inverted signal of the first signal, a signal which is substantially always set at "0", and a signal which is substantially always set at "1" only to the first-stage 2-input logic gates in a programmable fashion.

9. The circuit according to claim 8, wherein the output control input terminals of said first and second 3-state circuits of each of said 2-input logic gates other than the first-stage 2-input logic gates are supplied with complementary output control signals.

10. The circuit according to claim 9, wherein each stage except the final stage includes a plurality of said 2-input logic gates and the final stage includes one 2-input logic gate.

11. The circuit according to claim 10, wherein two 2-input logic gates are arranged in the first stage, one 2-input logic gate which receives outputs from said first-stage 2-input logic gates is arranged in the succeeding stage, and the output control input terminals of two 3-state circuits of said succeeding-stage logic gate are supplied with a third signal in the complementary form as said output control signal to constitute a 3-input logic gate.

12. The circuit according to claim 10, wherein four 2-input logic gates are arranged in the first stage, two 2-input logic gates each of which receives outputs from corresponding two of said four first-stage logic gates are arranged in the second stage, one 2-input logic gate which receives outputs from said second-stage 2-input logic gates is arranged in the third stage, the output control input terminals of two 3-state circuits of each of said second-stage logic gates are supplied with a third signal in the complementary form as said output control signal, and the output control input terminals of two 3-state circuits of said third-stage logic gate are supplied with a fourth signal in the complementary form as said output control signal to constitute a 4-input logic gate.

13. The circuit according to claim 10, wherein eight 2-input logic gates are arranged in the first stage, four 2-input logic gates each of which receives outputs from corresponding two of said eight first-stage logic gates are arranged in the second stage, two 2-input logic gates each of which receives outputs from corresponding two of said four second-stage logic gates are arranged in the third stage, one 2-input logic gate which receives outputs from said third-stage 2-input logic gates is arranged in the fourth stage, the output control input terminals of two 3-state circuits of each of said second-stage logic gates are supplied with a third signal in the complementary form as said output control signal, the output control input terminals of two 3-state circuits of each of said third-stage logic gates are supplied with a fourth signal in the complementary form as said output control signal, and the output control input terminals of two 3-state circuits of said fourth-stage logic gate are supplied with a fifth signal in the complementary form as said output control signal to constitute a 5-input logic gate.

14. The circuit according to claim 9, wherein each stage includes a plurality of said 2-input logic gates.

15. The circuit according to claim 14, wherein two 2-input logic gates are arranged in the first stage, one 2-input logic gate which receives outputs from said first-stage 2-input logic gates is arranged in the succeeding stage, and the output control input terminals of two 3-state circuits of said succeeding-stage logic gate are supplied with a third signal in the complementary form as said output control signal to constitute a first 3-input logic gate for outputting a first logic output signal, and two 2-input logic gates are arranged in the first stage, one 2-input logic gate which receives outputs from said first-stage 2-input logic gates is arranged in the succeeding stage, and the output control input terminals of two 3-state circuits of said succeeding-stage logic gate are supplied with a third signal in the complementary form as said output control signal to constitute a second 3-input logic gate for outputting a second logic output signal.

16. The circuit according to claim 15, wherein said supplying means supplies different combination signals to said 3-state circuits of said first-stage 2-input logic gate in said first 3-input logic gate and to said 3-state circuits of said first-stage 2-input logic gate in said second 3-input logic gate.

* * * * *